United States Patent
Willis (10) Patent No.: US 11,048,361 B1
(45) Date of Patent: Jun. 29, 2021

(54) SYSTEMS AND METHODS TO CREATE OFFSET SIGNAL USING SINEWAVE GENERATOR WITH PROGRAMMABLE AMPLITUDE AND PHASE

(71) Applicant: Alps Alpine Co., Ltd., Otaku (JP)

(72) Inventor: David Willis, Murray, UT (US)

(73) Assignee: Alps Alpine Co., Ltd.

( * ) Notice: Subject to any disclaimer, the term of this patent is extended or adjusted under 35 U.S.C. 154(b) by 0 days.

(21) Appl. No.: 16/844,327

(22) Filed: Apr. 9, 2020

(51) Int. Cl.
*G06F 3/045* (2006.01)
*G06F 3/041* (2006.01)
*G06F 3/044* (2006.01)

(52) U.S. Cl.
CPC .......... *G06F 3/04166* (2019.05); *G06F 3/044* (2013.01)

(58) Field of Classification Search
CPC ....... G06F 3/041; G06F 3/04166; G06F 3/044
See application file for complete search history.

(56) References Cited

U.S. PATENT DOCUMENTS

| | | | |
|---|---|---|---|
| 4,614,918 A | 9/1986 | Adrian et al. | |
| 7,528,755 B2* | 5/2009 | Hammerschmidt | G01C 19/56 341/143 |
| 8,547,114 B2* | 10/2013 | Kremin | H03M 11/02 324/678 |
| 2009/0201849 A1* | 8/2009 | Sawahashi | H04B 7/0669 370/328 |
| 2012/0033719 A1* | 2/2012 | Chen | H03C 5/00 375/224 |
| 2014/0327644 A1* | 11/2014 | Mohindra | G06F 3/04182 345/174 |
| 2016/0072437 A1 | 3/2016 | Beebe et al. | |
| 2019/0171331 A1* | 6/2019 | Gray | H03M 3/458 |
| 2019/0220148 A1 | 7/2019 | Hotelling et al. | |

OTHER PUBLICATIONS

Baker, R.. (2008). CMOS Mixed-Signal Circuit Design, Second Edition. p. 272.
Beer, Daniel. Pulse Density Modulation for Software DACs, Mar. 8, 2011, dlbeer.co.nz/articles/pdm.html. 5 pages.
Francis, Chris. 5 Ways to Generate a Sine Wave. Analog IC Tips, Dec. 8, 2017, www.analogictips.com/sine-wave-generation/. 5 pages.

* cited by examiner

*Primary Examiner* — Joe H Cheng
(74) *Attorney, Agent, or Firm* — Harness, Dickey & Pierce, P.L.C.

(57) ABSTRACT

A system for generating a control signal for a capacitive sensor includes a waveform generator configured to generate a digital waveform, a first sigma-delta modulator (SDM) configured to generate a first output corresponding to the control signal based on the digital waveform and first adjustment data and a second SDM configured to generate a second output corresponding to an offset signal based on the digital waveform and second adjustment data. The first SDM is configured to selectively adjust a phase and an amplitude of the control signal and the second SDM is configured to selectively adjust a phase and an amplitude of the offset signal.

22 Claims, 4 Drawing Sheets

SYSTEMS AND METHODS TO CREATE OFFSET SIGNAL USING SINEWAVE GENERATOR WITH PROGRAMMABLE AMPLITUDE AND PHASE

FIELD

The present disclosure relates to capacitive sensors, and more particularly to generating an offset signal for a sensed signal of a capacitive sensor.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An electronic device may implement a capacitive sensor configured to sense contact between an object (e.g., a finger) and a surface, such as a surface of the electronic device, and generate a signal indicative of the sensed contact. For example, a waveform generator is configured to generate and output a signal to the capacitive sensor. In some examples, the signal is sinusoidal (i.e., the signal is a sine wave). An amplitude and/or phase of the sine wave changes based on whether an object is contacting the sensor. Accordingly, the presence or absence of an object contacting the sensor can be determined based on changes in the amplitude or phase of the sine wave.

SUMMARY

A system for generating a control signal for a capacitive sensor includes a waveform generator configured to generate a digital waveform, a first sigma-delta modulator (SDM) configured to generate a first output corresponding to the control signal based on the digital waveform and first adjustment data and a second SDM configured to generate a second output corresponding to an offset signal based on the digital waveform and second adjustment data. The first SDM is configured to selectively adjust a phase and an amplitude of the control signal and the second SDM is configured to selectively adjust a phase and an amplitude of the offset signal.

In other features, the digital waveform is a digital sinewave. The waveform generator includes a lookup table configured to output the digital sinewave. The system further includes a first filter configured to filter the first output and a second filter configured to filter the second output. The first filter and the second filter are first order filters. At least one of the first filter and the second filter is a second or higher order filter. The control signal and the offset signal are oversampled relative to the digital waveform.

In other features, the system further includes the capacitive sensor. The first adjustment data includes first phase and amplitude adjustment data and the second adjustment data includes second phase and amplitude adjustment data. The first filter is a first low pass filter connected to the first output of the first SDM to generate the control signal, the second filter is a second low pass filter connected to the second output of the second SDM to generate the offset signal, the capacitive sensor is connected to an output of the first low pass filter corresponding to the control signal, wherein the capacitive sensor outputs a sensed signal, and the first phase and amplitude adjustment data and the second phase and amplitude adjustment data are selected such that the offset signal and the sensed signal output by the capacitive sensor have the same phase and amplitude when no object is in contact with the capacitive sensor. A differential amplifier has an inversion input terminal connected to an output of the capacitive sensor and a non-inversion input terminal connected to an output of the second low pass filter corresponding to the offset signal In other features, each of the first and second SDMs includes a quantizer configured to generate a quantized output based on the digital waveform and each of the first and second SDMs is configured to adjust a phase of the quantized output based on phase adjustment data of a respective one of the first and second adjustment data. Each of the first and second SDMs includes a feedback calculation module configured to generate a feedback value corresponding to a gain adjustment of the digital waveform based on the quantized output and amplitude adjustment data of the respective one of the first and second adjustment data.

A method for generating a control signal for a capacitive sensor includes generating a digital waveform, using a first sigma-delta modulator (SDM), generating a first output corresponding to the control signal based on the digital waveform and first adjustment data, using a second SDM, generating a second output corresponding to an offset signal based on the digital waveform and second adjustment data, using the first SDM, selectively adjusting a phase and an amplitude of the control signal, and using the second SDM, selectively adjusting a phase and an amplitude of the offset signal.

In other features, the digital waveform is a digital sinewave. The method further includes outputting the digital sinewave using a lookup table. The method further includes filtering the first output and the second output. The method further includes oversampling the control signal and the offset signal relative to the digital waveform. The method further includes detecting contact with and/or proximity to the capacitive sensor based on a difference between a sensed signal output by the capacitive sensor and the offset signal.

In other features, the first adjustment data includes first phase and amplitude adjustment data and the second adjustment data includes second phase and amplitude adjustment data. The method includes using a first low pass filter to filter the first output of the first SDM to generate the control signal, using a second low pass filter to filter the second output of the second SDM to generate the offset signal, and, using the capacitive sensor, receiving an output of the first low pass filter and the second low pass filter corresponding to the control signal and outputting a sensed signal. The first phase and amplitude adjustment data and the second phase and amplitude adjustment data are selected such that the offset signal and the sensed signal output by the capacitive sensor have the same phase and amplitude when no object is in contact with the capacitive sensor. The method further includes outputting a difference between the sensed signal and the offset signal by using a differential amplifier having an inversion input terminal connected to an output of the capacitive sensor and a non-inversion input terminal connected to an output of the second low pass filter corresponding to the offset signal.

In other features, the method further includes, using each of the first and second SDMs, generating a quantized output based on the digital waveform, adjusting a phase of the quantized output based on phase adjustment data of a respective one of the first and second adjustment data, and generating a feedback value corresponding to a gain adjustment of the digital waveform based on the quantized output and amplitude adjustment data of the respective one of the first and second adjustment data.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A change in a signal supplied to a capacitive sensor (corresponding to a sensed signal) in response to a contact with an object is typically small relative to the supplied signal and may be difficult to detect. Accordingly, different methods may be implemented to improve detection of the change. For example, a waveform generator that provides the signal to the sensor may also supply a duplicate of the signal or a second waveform generator can be provided to supply the duplicate of the signal. The duplicated signal is subtracted from the supplied signal and the result, which can be amplified to improve detection, corresponds to the sensed signal. In some examples, the waveform generator is a sinewave generator such as a Wein bridge oscillator. In other examples, the waveform generator may be configured to supply a digital sine wave to a digital-to-analog converter (DAC) and the output of the DAC is filtered and/or amplified.

Figure 1:
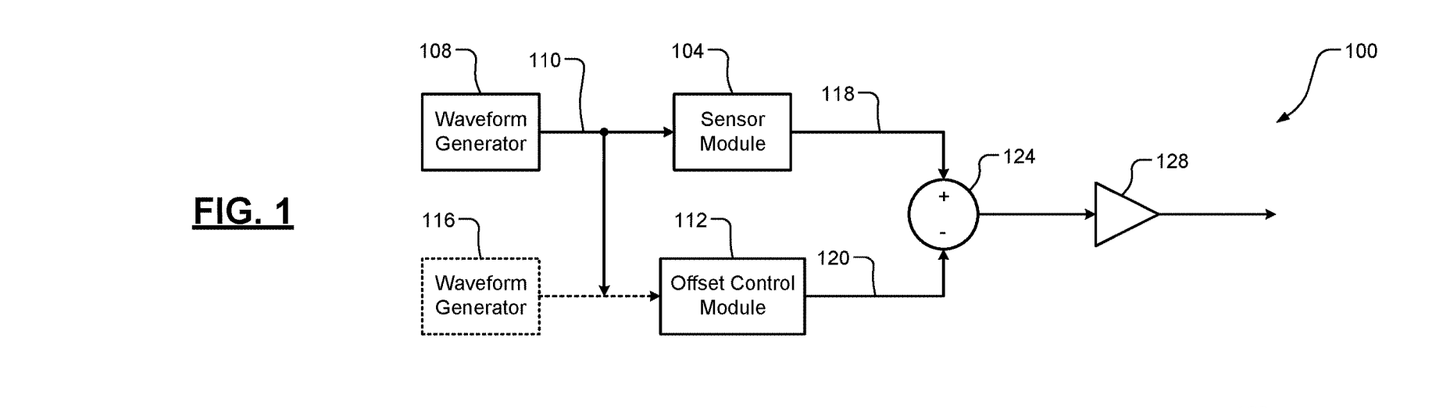
FIG. 1 is an example electronic device including a capacitive sensor.

Referring now to FIG. 1, an example electronic device 100 including a sensor module 104 corresponding to a capacitive sensor is shown. A waveform generator 108 supplies a control or drive signal (e.g., a sinewave) 110 to the sensor module 104. The waveform generator 108 may supply the control signal to an offset control module 112 or an optional second waveform generator 116 may provide a duplicate of the control signal to the offset control module 112.

The sensor module 104 modifies the control signal 110 and generates a sensed signal 118 based on the control signal 110. The sensed signal 118 is indicative of whether an object (e.g., a finger) is in contact with the sensor module 104. In some example, the sensed signal 118 indicates a proximity of the object to the sensor module 104. The sensed signal 118 may differ (e.g., in amplitude and/or phase) from the control signal 110 regardless of whether an object is in contact with the sensor module 104.

The offset control module 112 is configured to generate an offset signal 120 that is a duplicate of the sensed signal 118 without contact between an object and the sensor module 104. In other words, the offset control module 112 is configured to modify the control signal 110 in the same manner as the sensor module 104 when there is no contact between an object and the sensor module 104 (and/or, in some examples, when the object is not sufficiently near the sensor module 104 to affect the sensed signal 118). As such, when there is no contact with an object, the sensed signal 118 and the offset signal 120 will be approximately the same (e.g., in magnitude, phase, and/or both magnitude and phase) and a difference between the sensed signal 118 and the offset signal 120 will approach zero.

Conversely, when there is contact between an object and the sensor module 104, the offset signal 120 and the sensed signal 118 will be different. A subtractor 124 outputs a difference between the offset signal 120 and the sensed signal 118, which is amplified by an amplifier 128. The output of the amplifier 128 may then be processed to detect contact with the sensor module 104. For example, contact may be determined based on whether an amplitude and/or a phase of the output of the amplifier 128 exceeds a respective threshold. In some examples, the sensed signal 118 may be indicative of a proximity of the object to the sensor module 104 regardless of whether the object is in direct contact with the sensor module 104. In these examples, the sensed signal 118 may be further indicative of a distance between the object and the sensor module 104.

Figure 2A:
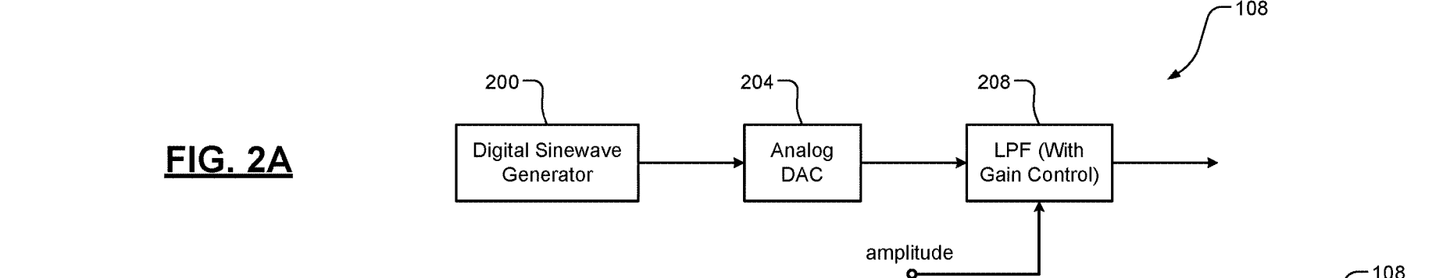
FIGS. 2A and 2B are example waveform generators for a capacitive sensor.
Figure 2B:
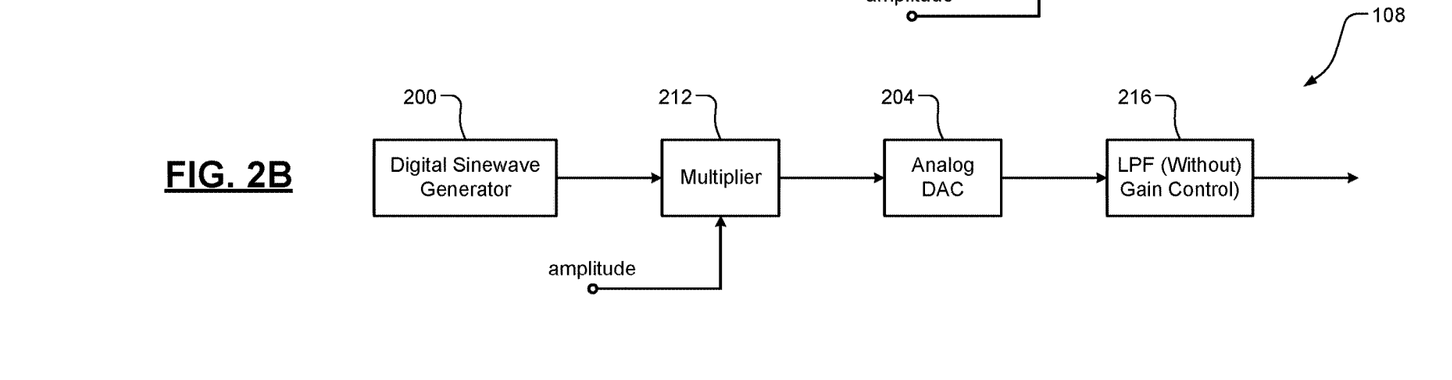

For example only, the waveform generator 108 implements a Wein bridge oscillator, which may be difficult to tune and/or to modulate amplitude. In other examples, the waveform generator 108 may generate a digital sinewave. For example, as shown in FIGS. 2A and 2B, the waveform generator 108 may include a digital sinewave generator 200. In FIG. 2A, an analog DAC 204 converts the digital sinewave to an analog signal, which is then filtered and amplified (or, in some examples, attenuated) using a low pass filter (LPF) 208 having gain control capabilities. The LPF 208 may be a first order filter to reduce cost or, in some examples, may be a second, third, or higher order filter. For example, an amplitude control signal is provided to the LPF 208 to control the gain. In other examples, a band pass filter may be used.

Conversely, in FIG. 2A, a multiplier 212 is provided between the digital sinewave generator 200 and the analog DAC 204. The amplitude control signal is provided to the multiplier 212 to control the gain and the output of the multiplier (corresponding to the amplified digital sinewave) is provided to the analog DAC 204. The analog signal output by the analog DAC 204 is filtered using an LPF 216 without gain control.

DACs such as the DAC 204 increase power consumption and area on an integrated circuit, are difficult to design and implement for accurate amplitude and phase control, and have temperature and process variation. Other components such as the LPF 208 with gain control and the multiplier 212 similarly require increased integrated circuit area and cost and/or introduce design difficulties.

Systems and methods according to the present disclosure implement sigma-delta modulation to generate a control or drive signal for a capacitive sensor. More specifically, sigma-delta modulators for a capacitive sensor, according to the present disclosure, are configured to process a digital sinewave and to implement amplitude and phase control of the processed digital sinewave.

Figure 3:
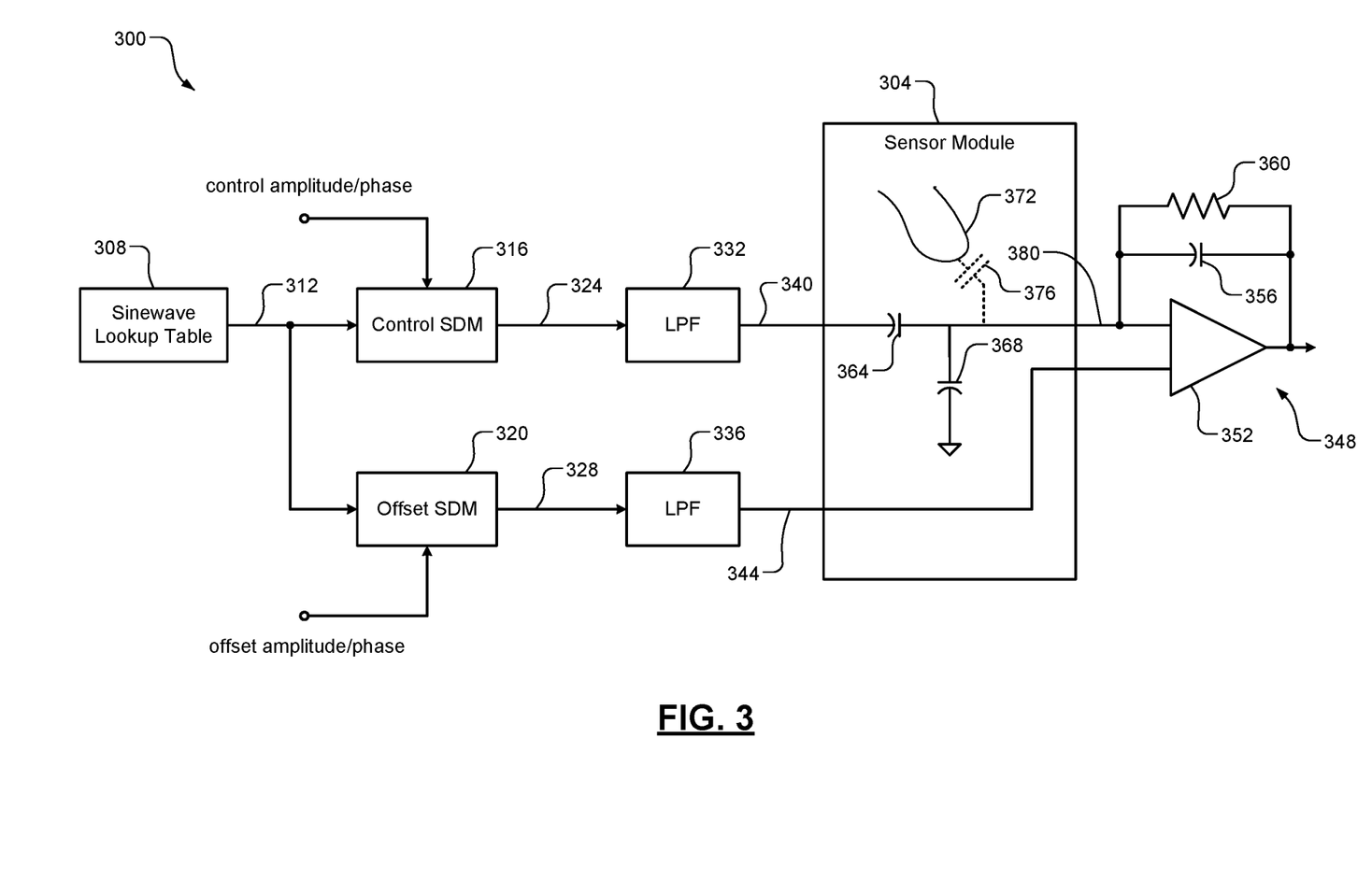
FIG. 3 is an example electronic device implementing sigma-delta modulation for a capacitive sensor according to the present disclosure.

Referring now to FIG. 3, an example electronic device 300 including a sensor module 304 (e.g., a capacitive sensor) and implementing sigma-delta modulation according to the present disclosure is shown. A waveform generator such as a sinewave generator (e.g., implemented using a sinewave lookup table (LUT) 308) outputs a digital waveform (e.g., a digital sinewave 312). For example, the digital sinewave 312 is an M-bit binary representation of sinewave voltage levels.

The digital sinewave is supplied to a control signal module (e.g., a first sigma-delta modulator (SDM) 316) and an offset signal module (e.g., a second SDM 320). The SDMs 316 and 320 are configured to generate first and second outputs (e.g., multi-bit, pulse density modulated sinewaves) 324 and 328, respectively, based on the digital sinewave 312 using variable feedback to control amplitude and phase. The SDMs 316 and 320 may be clocked at a frequency greater than a frequency of the digital sinewave 312 to reduce filtering requirements.

The SDM 316 receives a control amplitude/phase adjustment signal (e.g., first adjustment data that includes first phase and amplitude adjustment data) and the SDM 320 receives an offset amplitude/phase adjustment signal (e.g., second adjustment data that includes second phase and amplitude adjustment data) and the outputs 324 and 328 of the SDMs 316 and 320 may be adjusted (e.g., in amplitude and/or phase) in accordance with the respective adjustment signals. For example, the adjustment signals may be calibrated values stored in respective registers.

The outputs 324 and 328 of the SDMs 316 and 320 are connected to respective analog first and second LPFs 332 and 336. The LPFs 332 and 336 are configured to filter high frequency noise and a high frequency component of the pulse density modulated signal from the outputs 324 and 328. For example, the LPFs 332 and 336 are first order filters. In some examples, LPFs 332 and 336 oversample the sinewaves 324 and 328 relative to the digital sinewave 312 provided to the SDMs 316 and 320 and the resulting samples are interpolated. Outputs of the LPFs 332 and 336 correspond to a control signal 340 and an offset signal 344, respectively. The control signal 340 is provided to the sensor module 304 and the offset signal 344 is provided as an input to an example output circuit 348 including an amplifier 352, a feedback capacitor 356, and a feedback resistor 360. The output circuit 348 is shown for example only and other configurations of the output circuit 348 may be used. For example, in some implementations, the feedback capacitor 356 and/or the feedback resistor 360 may be omitted. For example, the amplifier 352 is a differential amplifier and has an inversion input terminal connected to the output of the sensor module 304 and a non-inversion input terminal connected to the output of the second LPF 336. Specifically, the sensor module 304 has one or more sensing electrodes connecting to the inversion input terminal of the differential amplifier 352.

The sensor module 304 corresponds to a capacitive sensor (e.g., a capacitive touch circuit) including parasitic capacitances 364 and 368 that modify an amplitude and phase of the control signal 340. The output of the first LPF 332 is connected to the one or more sensing electrodes through the capacitance 364. When an object (e.g., finger 372) contacts the one or more sensing electrodes (the sensor module 304), a capacitance 376 of the finger 372 further modifies the amplitude and phase of the control signal 340. Accordingly, the sensor module 304 generates a sensed signal 380 indicative of whether an object such as the finger 372 is in contact with the sensor module 304 or, in some examples, a proximity of the finger 372 to the sensor module 304.

The output circuit 348 (the differential amplifier 352) detects and outputs a difference between the sensed signal 380 and the offset signal 344. For example, the respective adjustment signals of the SDMs 316 and 320 include first phase and amplitude adjustment data and second phase and amplitude data, respectively, that are selected such that the sensed signal 380 and the offset signal 344 (i.e., respective amplitudes and phases of the sensed signal 380 and the offset signal 344) are the same when there is no contact between the sensor module 304 (e.g., the one or more sensing electrodes) and an object such as the finger 372. In other words, the SDM 316 is configured to selectively adjust a phase and an amplitude of the control signal 340 to correspondingly adjust the phase and amplitude of the sensed signal, and the second SDM 320 is configured to adjust a phase and an amplitude of the offset signal 344 such that the output of the differential amplifier 352 becomes substantially zero when there is no contact between the sensor module 304 (the one or more sensing electrodes) and the object. In this manner, the output of the output circuit 348 indicates whether there is contact between the sensor module 304 and the finger 372 or, in some examples, a proximity of the finger 372 to the sensor module 304.

Figure 4A:
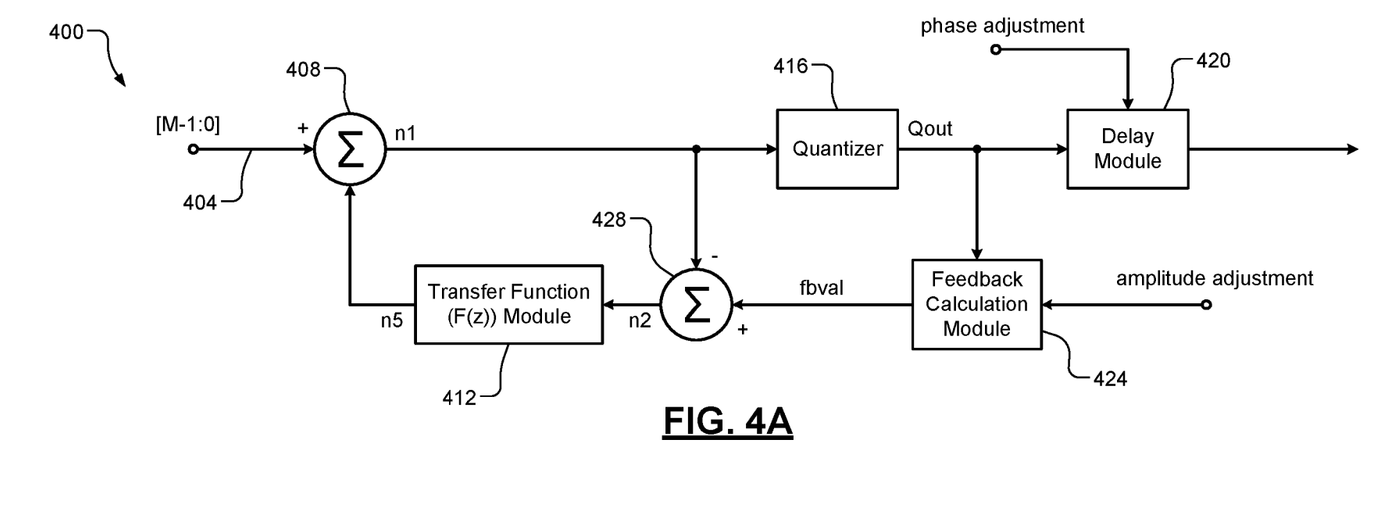
FIGS. 4A and 4B show an example of a sigma-delta modulator according to the present disclosure.
Figure 4B:
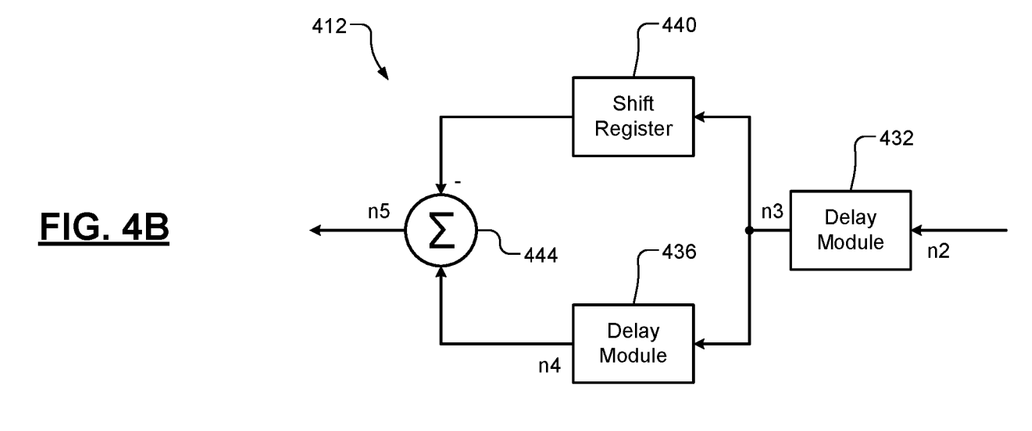

Referring now to FIGS. 4A and 4B, an example SDM 400 (e.g., corresponding to the SDMs 316 and 320) according to the present disclosure is shown in more detail. The SDM 400 receives a digital sinewave 404 (e.g., corresponding to the digital sinewave 312 of FIG. 3) including, for example, an M-bit binary representation of sinewave voltage levels. A summing module 408 receives the digital sinewave 404 and an output (e.g., a signal n5) of a transfer function (F(z)) module 412. The transfer function module 412 is shown in more detail in FIG. 4B.

An output (e.g., a signal n1 including a digital waveform) of the summing module (e.g., a digital adder) 408 corresponds to a sum of the digital sinewave 404 and the output n5 of the transfer function module 412. A quantizer 416 receives n1 and is configured to generate a quantized output Qout based on the signal n1. For example, Qout has a value corresponding to a comparison between a value of n1 and a fixed value. Accordingly, Qout is a one or two bit value indicative of n1. In other examples, Qout may be three or more bits. For example, if the quantizer 416 is a single-bit quantizer, Qout is 1 or 0. Conversely, if the quantizer 416 is a two-bit quantizer, Qout is 00, 01, 10, or 11.

Qout is provided to a delay module 420 and a feedback calculation module 424. An output of the delay module 420 is a quantized (i.e., digital), phase-adjusted representation of the digital sinewave 404 provided to the capacitive sensor (e.g., the sensor module 304). In other words, the output of the delay module 420 is a pulse density modulated signal where high density corresponds to a higher voltage and low density corresponds to a lower voltage. For example, the delay module 420 applies a delay based on a phase adjustment signal including phase adjustment data. The phase adjustment signal corresponds to a phase component of the control or offset amplitude/phase adjustment signal of FIG. 3. Accordingly, the delay can be calibrated such that phases of respective outputs (e.g., of SDMs 400 corresponding to the sensed signal 380 and the offset signal 344) are the same when there is no contact between the sensor module 304 and an object such as the finger 372. In other words, the SDM 400 adjusts the phase of the quantized output Qout based on the phase adjustment data.

Conversely, the feedback calculation module 424 calculates a feedback value fbval corresponding to a gain adjustment based on Qout and an amplitude adjustment signal including amplitude adjustment data. The amplitude adjustment signal corresponds to an amplitude component of the control or offset amplitude/phase adjustment signal of FIG.

3. Accordingly, the gain can be calibrated such that amplitudes of respective outputs (e.g., of SDMs 400 corresponding to the sensed signal 380 and the offset signal 344) are the same when there is no contact between the sensor module 304 and an object such as the finger 372.

For example, the feedback calculation module 424 outputs fbval based on Qout and a feedback gain Gf that is selected in accordance with the amplitude adjustment signal. In one example, Gf is a fixed value that is adjusted upward or downward in accordance with the amplitude adjustment signal and fbval is an adjustment of Gf based on Qout. For example, if Qout is one bit, fbval can be either one positive or one negative value (i.e., depending on whether Qout is 1 or 0) calculated using Gf. Conversely, if Qout is two bits, fbval can be one of two positive values or one of two negative values (i.e., depending on whether Qout is 00, 01, 10, or 11) calculated using Gf. In other words, the feedback calculation module 424 is configured to generate the feedback value fbval corresponding to a gain adjustment of the digital sinewave (i.e., waveform) 404 based on Qout and the amplitude adjustment data.

The feedback value fbval is provided to a difference module (e.g., a digital subtractor) 428 configured to output (as a signal n2) a difference between fbval and n1. The signal n2 is provided to the transfer function module 412, which is configured to calculate and output n5 based on n2. One example implementation of the transfer function module 412 shown in FIG. 4B includes delay modules 432 and 436, a shift register (e.g., a shift left register) 440, and a difference module (e.g., a digital subtractor) 444. The delay module 432 delays n2 (e.g., by one clock cycle ($z^{-1}$)) and outputs n3 accordingly. The signal n3 (corresponding to the delayed n2) is provided to the shift register 440 and the delay module 436.

The shift register 440 functions as a multiplier to multiply the signal n3. For example, an output of the shift register 440 may correspond to 2*n3. The delay module 436 delays n3 (e.g., by one clock cycle ($z^{-1}$)) and outputs n4 accordingly. The signal n4 (corresponding to the delayed n3) and the output of the shift register 440 are provided to the difference module 428, which outputs n5 based on a difference between n4 and the output of the shift register 440. Accordingly, in this example, n5=n4−(2*n3).

Figure 5:
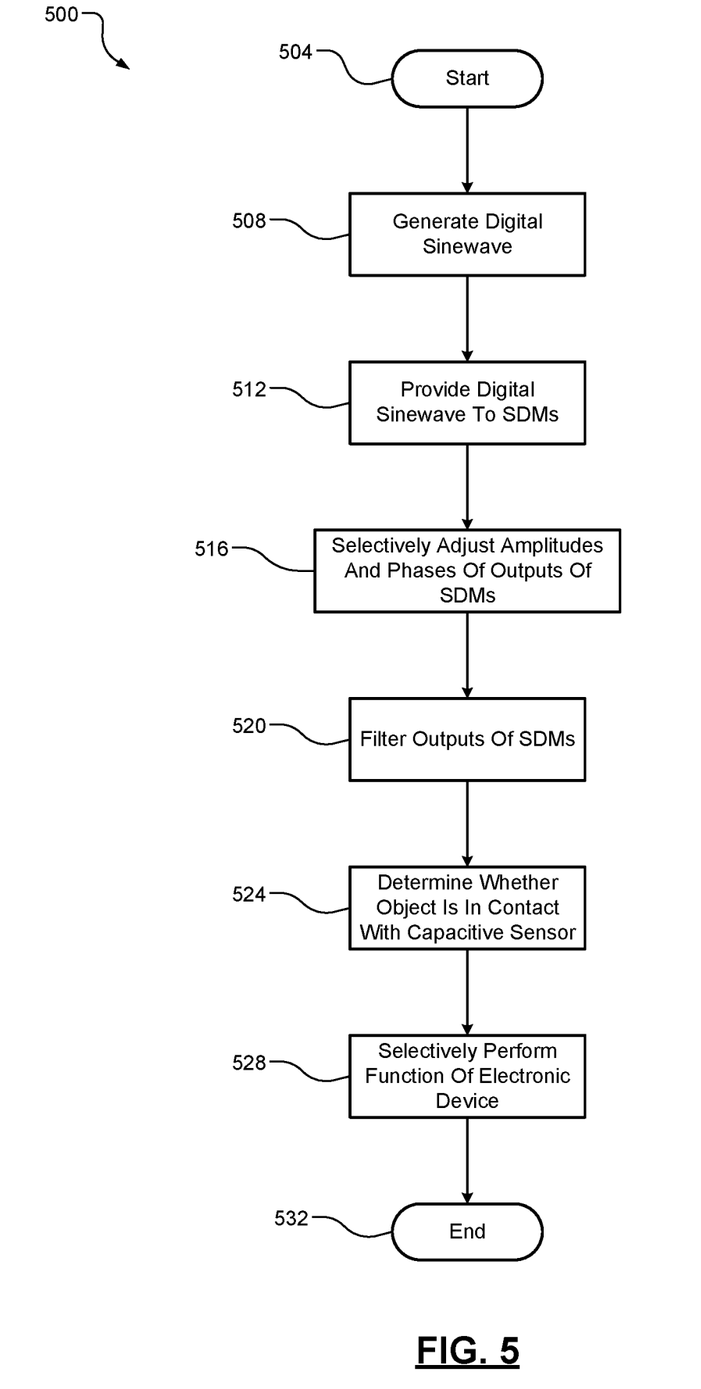
FIG. 5 is an example method of generating a waveform for a capacitive sensor according to the present disclosure.

Referring now to FIG. 5, an example method 500 of generating a waveform for a capacitive sensor according to the present disclosure begins at 504. At 508, the method 500 (e.g., using the sinewave lookup table 308 or another waveform generator) generates a digital sinewave corresponding to a control or drive signal for a capacitive sensor. For example, the digital sinewave is an M-bit digital signal. At 512, the method 500 provides the digital sinewave to a control signal module and an offset signal module (e.g., the control SDM 316 and the offset SDM 320 as shown in FIG. 3).

At 516, the method 500 selectively adjusts amplitudes and phases of the outputs of the SDMs 316 and 320. For example, the amplitudes and phases are adjusted based on respective phases and amplitude adjustment signals as described above in FIG. 4. At 520, the method 500 (e.g., using filters such as LPFs 332 and 336) filters the outputs of the SDMs 316 and 320. At 524, the method 500 determines whether an object (e.g., the finger 372) is in contact with a sensing surface of a capacitive sensor. For example, the method 500 compares the sensed signal 380 to the offset signal 344 using the output circuit 348 as described above in FIG. 3. At 528, the method 500 selectively performs a function of an electronic device based on a result of the comparison. The method 500 ends at 532.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system for generating a control signal for a capacitive sensor, the system comprising:
    a waveform generator configured to generate a digital waveform;
    a first sigma-delta modulator (SDM) configured to generate a first output based on the digital waveform and first adjustment data, wherein the first output corresponds to the control signal; and
    a second SDM configured to generate a second output based on the digital waveform and second adjustment data, wherein the second output corresponds to an offset signal,
    wherein the first SDM is configured to selectively adjust a phase and an amplitude of the control signal and the second SDM is configured to selectively adjust a phase and an amplitude of the offset signal.

2. The system of claim 1, wherein the digital waveform is a digital sinewave.

3. The system of claim 2, wherein the waveform generator includes a lookup table configured to output the digital sinewave.

4. The system of claim 1, further comprising a first filter configured to filter the first output and a second filter configured to filter the second output.

5. The system of claim 4, wherein the first filter and the second filter are first order filters.

6. The system of claim 4, wherein at least one of the first filter and the second filter is a second or higher order filter.

7. The system of claim 4, wherein the control signal and the offset signal are oversampled relative to the digital waveform.

8. The system of claim 4, further comprising the capacitive sensor.

9. The system of claim 8, wherein the first adjustment data includes first phase and amplitude adjustment data and the second adjustment data includes second phase and amplitude adjustment data.

10. The system of claim 9, wherein:
    the first filter is a first low pass filter connected to the first output of the first SDM to generate the control signal;
    the second filter is a second low pass filter connected to the second output of the second SDM to generate the offset signal;
    the capacitive sensor is connected to an output of the first low pass filter corresponding to the control signal, wherein the capacitive sensor outputs a sensed signal; and
    the first phase and amplitude adjustment data and the second phase and amplitude adjustment data are selected such that the offset signal and the sensed signal output by the capacitive sensor have the same phase and amplitude when no object is in contact with the capacitive sensor.

11. The system of claim 10, further comprising a differential amplifier having an inversion input terminal connected to an output of the capacitive sensor and a non-inversion input terminal connected to an output of the second low pass filter corresponding to the offset signal.

12. The system of claim 1, wherein each of the first and second SDMs includes:
- a quantizer configured to generate a quantized output based on the digital waveform, wherein each of the first and second SDMs is configured to adjust a phase of the quantized output based on phase adjustment data of a respective one of the first and second adjustment data; and
- a feedback calculation module configured to generate a feedback value corresponding to a gain adjustment of the digital waveform based on the quantized output and amplitude adjustment data of the respective one of the first and second adjustment data.

13. A method for generating a control signal for a capacitive sensor, the method comprising:
- generating a digital waveform;
- using a first sigma-delta modulator (SDM), generating a first output based on the digital waveform and first adjustment data, wherein the first output corresponds to the control signal;
- using a second SDM, generating a second output based on the digital waveform and second adjustment data, wherein the second output corresponds to an offset signal;
- using the first SDM, selectively adjusting a phase and an amplitude of the control signal; and
- using the second SDM, selectively adjusting a phase and an amplitude of the offset signal.

14. The method of claim 13, wherein the digital waveform is a digital sinewave.

15. The method of claim 14, further comprising outputting the digital sinewave using a lookup table.

16. The method of claim 13, further comprising filtering the first output and the second output.

17. The method of claim 13, further comprising oversampling the control signal and the offset signal relative to the digital waveform.

18. The method of claim 13, further comprising detecting contact with the capacitive sensor based on a difference between a sensed signal output by the capacitive sensor and the offset signal.

19. The method of claim 13, wherein the first adjustment data includes first phase and amplitude adjustment data and the second adjustment data includes second phase and amplitude adjustment data.

20. The method of claim 19, further comprising:
- using a first low pass filter to filter the first output of the first SDM to generate the control signal;
- using a second low pass filter to filter the second output of the second SDM to generate the offset signal; and
- using the capacitive sensor, receiving an output of the first low pass filter corresponding to the control signal and outputting a sensed signal,
- wherein the first phase and amplitude adjustment data and the second phase and amplitude adjustment data are selected such that the offset signal and the sensed signal output by the capacitive sensor have the same phase and amplitude when no object is in contact with the capacitive sensor.

21. The method of claim 20, further comprising:
- outputting a difference between the sensed signal and the offset signal by using a differential amplifier having an inversion input terminal connected to an output of the capacitive sensor and a non-inversion input terminal connected to an output of the second low pass filter corresponding to the offset signal.

22. The method of claim 13, further comprising, using each of the first and second SDMs:
- generating a quantized output based on the digital waveform;
- adjusting a phase of the quantized output based on phase adjustment data of a respective one of the first and second adjustment data; and
- generating a feedback value corresponding to a gain adjustment of the digital waveform based on the quantized output and amplitude adjustment data of the respective one of the first and second adjustment data.

* * * * *